(12) United States Patent
Mochizuki

(10) Patent No.: US 7,190,422 B2
(45) Date of Patent: Mar. 13, 2007

(54) ELECTRO-OPTICAL DEVICE AND ELECTRONIC APPARATUS

(75) Inventor: Hiroaki Mochizuki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/765,056

(22) Filed: Jan. 28, 2004

(65) Prior Publication Data

US 2004/0218111 A1 Nov. 4, 2004

(30) Foreign Application Priority Data

Feb. 7, 2003 (JP) ............... 2003-030999
Jan. 16, 2004 (JP) ............... 2004-009170

(51) Int. Cl.
*G02F 1/136* (2006.01)
*G02F 1/1345* (2006.01)

(52) U.S. Cl. ............... 349/44; 349/43; 349/110; 349/149; 349/151; 257/59; 257/72; 345/92

(58) Field of Classification Search ............... 349/43, 349/44, 110, 149, 151; 257/59, 72; 345/92
See application file for complete search history.

(56) References Cited

U.S. PATENT DOCUMENTS

| | | | |
|---|---|---|---|
| 5,521,728 A | | 5/1996 | Kodate et al. |
| 5,929,501 A | * | 7/1999 | Shin et al. ............... 257/448 |
| 5,952,708 A | * | 9/1999 | Yamazaki ............... 257/643 |
| 6,040,200 A | * | 3/2000 | Hayashi et al. ............... 438/30 |
| 6,330,044 B1 | * | 12/2001 | Murade ............... 349/44 |
| 6,525,787 B1 | * | 2/2003 | Sato ............... 349/43 |

FOREIGN PATENT DOCUMENTS

| | | |
|---|---|---|
| CN | 1195786 A | 10/1998 |
| JP | A 64-052129 | 2/1989 |
| JP | A 02-211672 | 8/1990 |
| JP | A 11-084359 | 3/1999 |
| JP | A 11-194360 | 7/1999 |
| JP | A 2000-193961 | 7/2000 |
| JP | A 2001-100251 | 4/2001 |
| JP | 2001-305585 | * 10/2001 |
| JP | A 2002-221738 | 8/2002 |
| KR | 1995-25474 | 8/1995 |
| TW | 357277 | 5/1999 |

* cited by examiner

*Primary Examiner*—Huyen Ngo
(74) *Attorney, Agent, or Firm*—Oliff & Berridge, PLC

(57) ABSTRACT

An electro-optical device includes, on a TFT array substrate, a data line, a scanning line, a switching element, and a pixel electrode and the like, the substrate having an image display region defined as a region to form the pixel electrode and the switching element, and a peripheral region to define the surrounding area of the image display region, the peripheral region being configured by including a TFT to determine whether the image signal will be applied to the data line, and a light shielding film which is formed via the TFT and the interlayer insulating film, the light shielding film overlapping at least a portion of the TFT in plan view. The electro-optical device is capable of reducing or preventing the breakdown of the switching element and obtaining the precise operation of the switching element by not creating a crack in the interlayer insulating film or the like between the switching element and the light shielding film.

8 Claims, 11 Drawing Sheets

F I G. 1 0
X2　　　　　　　　　　　　　　　　　　　　　　　X2'
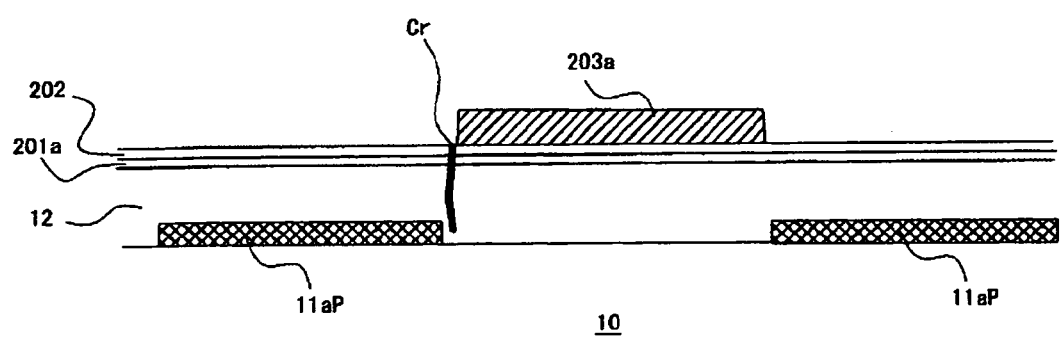

ELECTRO-OPTICAL DEVICE AND ELECTRONIC APPARATUS

BACKGROUND OF THE INVENTION

1. Field of Invention

The present invention relates to an electro-optical device, such as an active matrix addressing liquid crystal device, an electrophoresis similar to an electronic paper, an EL (electro-luminescence) display device, and an electronic emission device (field emission display and surface-conduction electron-emitter display). Further, the present invention relates to an electronic apparatus including such an electro-optical device.

2. Description of Related Art

A related art electro-optical device, such as a so-called active matrix addressing liquid crystal display, is known which, for example, includes pixel electrodes arranged in a matrix, thin film transistors (hereinafter "TFT") connected to each of the electrodes, and data lines and scanning lines connected to each of the TFTs and provided parallel to the row and column directions, respectively, on a substrate.

In addition to the above-mentioned configuration, such an electro-optical device may include, on the substrate, a variety of circuits, such as a precharge circuit, to apply an image signal suitably to a data line, a sampling circuit, a data line driving circuit, or a scanning line driving circuit to apply a scanning signal suitably to a scanning line. Such circuits are normally provided in the vicinity of an image displaying area, where pixel electrodes or TFTs are defined to be arranged in a matrix. Also, such circuits include circuit elements, such as a switching element, or wires, if necessary. In this way, the active matrix addressing is made possible by appropriately driving the data line or scanning line by a variety of circuits provided on the peripheral area.

However, the switching element composing such variety of circuits has the following problems. That is, a projection display having a liquid crystal display includes, in addition to the above-described various elements, a counter substrate disposed to face the substrate, and a liquid crystal layer disposed between the substrate and the counter substrate, a light component being transmitted from a relatively powerful light source to the liquid crystal display. In the event that projection light is illuminated from the counter substrate, the light is transmitted through the liquid crystal layer and the substrate, and finally projected on a screen, thereby configuring an image. However, the direction of light within a liquid crystal display is, in fact, not always regular. For instance, the light once emitted from the liquid crystal display may possibly be reflected on a variety of elements within a mounting case for accommodating the liquid crystal display, resulting in the light returning to the liquid crystal display. Also, there has been known a related art projection display capable of displaying color where, for example, three liquid crystal displays corresponding to red, green, and blue are disposed to face one another with a prism thereamong, two liquid crystal displays may be disposed to face each other with the prism therebetween. In this case, light emitted from one liquid crystal display is incident on the other liquid crystal display more directly from the direction opposite to the direction on which the projection light is originally incident.

If there exists such returned light, the returned light incident on the switching element may cause its operation to malfunction. That is, in the event that the switching element is a TFT including a semiconductor layer, the returned light may possible be incident on the semiconductor layer, especially in its channel region, and the semiconductor layer may be excited, generating a light leak current which may disturb the accurate control of conduction or non-conduction in the channel region.

In order to cope with the above-described problems, a technique such as that disclosed in Japanese Unexamined Patent Application Publication No. 11-194360 is related art. The electro-optical device of Japanese Unexamined Patent Application Publication No. 11-194360 includes a light shielding film in the lower side of the switching element. Owing to the light shielding film, even though returned light is incident from the direction opposite to the incidence direction of the projection light, the progress of light can be blocked before it reaches the switching element.

However, the above-described electro-optical device has the following problems. That is, since the above-mentioned configuration for providing a light shielding film below the switching element on the substrate has a laminated structure of the light shielding film, an interlayer insulating film thereon, a semiconductor layer of a TFT which is a switching element thereon, a gate insulating film, and a gate electrode film, a crack may be created in the interlayer insulating film and even in the semiconductor layer owing to the relationship between the gate electrode film and the light shielding film. Such phenomenon may cause the switching element to break. That is, a crack is created when the edges of the gate electrode film and the light shielding film are formed not to overlap each other in plan view, and it is most likely to be created especially when the edges of both of them are in the same line.

SUMMARY OF THE INVENTION

The present invention is made in view of the above-mentioned problems. Accordingly, the present invention provides an electro-optical device capable of reducing or preventing the breakdown of the switching element and obtaining the precise operation of the switching element by not creating a crack in the interlayer insulating film or the like between the switching element and the light shielding film. Further, the present invention provides an electronic apparatus including the above-mentioned electro-optical device.

In order to address the above-mentioned problems, the electro-optical device according to an aspect of the present invention includes, on a substrate, a data line extending in a certain direction and a scanning line extending in a direction crossing the data line, a first switching element to which a scanning signal is applied by the scanning line, and a pixel electrode to which an image signal is applied, by the data line, via the first switching element, the substrate having an image display region defined as a region to form the pixel electrode and the switching element, and a peripheral region to define the area surrounding the image display region, the peripheral region being configured by including a second switching element to determine whether the image signal will be applied to the data line and the scanning signal will be applied to the scanning line, a light shielding film being formed with the second switching element and the interlayer insulating film therebetween the light shielding film overlapping at least a portion of the second switching element in plan view.

According to the electro-optical device of an aspect of the present invention, the ON/OFF state of a TFT is controlled by applying a scanning signal to the TFT, which is an example of a switching element, via a scanning line. On the other hand, an image signal is applied to a pixel electrode via a data line, the application or non-application of an image signal to a pixel electrode being determined depending on the ON/OFF state of the TFT. This causes the electro-optical device according to an aspect of the present invention to be active-matrix addressed. Also, the electro-optical device of an aspect of the present invention has a substrate which is divided into an image display region and a peripheral region, there is provided in the peripheral region a second switching element to determine whether the image signal will be applied to the data line and/or whether the scanning signal will be applied to the scanning line. The second switching element is typically a TFT, like the first switching element.

In an aspect of the present invention, a light shielding film is provided through the second switching element and the interlayer insulation film, especially in the peripheral region, and the light shielding film overlaps at least a portion of the second switching element in plan view. Since the light shielding film and the gate electrode film composing a TFT, which is an example of a second switching element, overlap each other, at least partially, there is no portion where stress is extremely concentrated between both of them. Therefore, it is possible to reduce the possibility of or prevent a crack from being created in the interlayer insulating film located between the second switching element and the light shielding film, and thus to reduce or prevent the switching element from breaking.

The second switching element according to an aspect of the present invention is included, for example, in a sampling circuit disposed between a data line and an image signal line, and a TFT, which is turned on or off according to a control signal generated from a data line driving circuit, corresponds to the second switching element.

In accordance with an aspect of the electro-optical device of the present invention, the second switching element has a laminated structure of a semiconductor layer, an insulating film and an electrode film, and the light shielding film overlaps at least a portion of the electrode film in plan view.

According to this aspect, the above-described effect can be obtained in an interlayer insulating film located between an electrode film, which is a portion of the second switching elements and a light shielding film. In this case, since the semiconductor layer is located between the electrode film and the light shielding film, a crack cannot be created in the semiconductor layer as well. Therefore, according to this aspect, it is possible to more reliably reduce or prevent the breakdown of the second switching element. Also, since it is assumed that the most probable cause of the creating a crack lies in the stress caused by the electrode film and the light shielding film in this aspect having such a laminated structure, it is possible to more effectively reduce or prevent a crack from being created by overlapping, at least partially, the electrode film and the light shielding film each other.

In accordance with this aspect, the semiconductor layer has a channel region, and a source region and a drain region with the channel region therebetween, and the electrode film is formed in the portion corresponding to the channel region. The light shielding film is formed in portions corresponding to the source region and the drain region but may not be formed in the portion corresponding to the channel region.

According to such a configuration, a semiconductor layer has a source region, a channel region, and a drain region, for example, along a certain direction. In the portion corresponding to the channel region, an electrode film is formed but a light shielding film is not formed. Also, the light shielding film is formed in portions corresponding to the source region and the drain region. That is, the light shielding film is formed in portions corresponding to the source region and the drain region respectively with a portion corresponding to the channel region therebetween, both portions being separated. This causes the light shielding film not to serve as a medium when the light shielding film affects the other region, in the case of electrically contacting to either the source region or the drain region. That is, according to this aspect, a situation does not occur in which so-called parasitic capacitance is generated between the source and the drain.

It is possible to obtain the above-described effect in this aspect as well, since the light shielding film overlaps at least a portion of the electrode film each other.

In accordance with another aspect of the electro-optical device of the present invention, the light shielding film and the electrode film are rectangular in plan view, and the light shielding film overlaps the electrode film on the long side of the rectangle in plan view.

According to this aspect, since the light shielding film and the electrode film overlap each other in the respective long sides, both films overlap each other over a relatively long distance. As described above, stress is not extremely concentrated in the overlapping portion. Therefore, a crack created in an interlayer insulating film located between a light shielding film and an electrode film may be more easily prevented.

The "rectangle" mentioned in this aspect does not refer to the planes of the light shielding film and the electrode film are formed in an exact rectangle.

In accordance with a further aspect of the electro-optical device of the present invention, the second switching element is formed concurrently with the first switching element in the manufacturing step of the electro-optical device.

According to this aspect, it is possible to simplify the manufacture process or lower the manufacturing cost, since the first and second switching elements are formed at the same time.

The "Forming at the same time" refers to, for instance, when the first and second switching elements have, as TFTs, a laminated structure of a semiconductor layer, a gate insulating film, and a gate electrode film, the formation of precursor films of the respective elements and the patterning process to these precursor films are performed at the same time. For instance, when a gate electrode film of the first switching element is formed, a gate electrode film of the second switching element is also formed simultaneously (i.e., the formation of the common precursor film and the patterning process to the common precursor film are performed).

In accordance with an aspect of the electro-optical device of the present invention, the light shielding film overlaps at least a portion of the first switching element.

According to this aspect, the same effect can be obtained in the first switching element as well as in the second switching element. That is, since the light shielding film overlaps at least a portion of the first switching element, it is possible to reduce or prevent a crack from being created in an interlayer insulating film or the like located between the first switching element and the light shielding film.

In accordance with a still further aspect of the electro-optical device of the present invention, the light shielding film is made of light shielding material.

According to this aspect, the light shielding film is made of light shielding material, such as metallic simple substance, alloy, metal silicide, polysilicide, or a laminated structure of these, including at least one refractory metal, such as Ti (titanium), Cr (chromium), W (tungsten), Ta (tantalum), or Mo (molybdenum), in addition to for example, Al (aluminum) which has relatively large reflectance. Therefore, it is possible to obtain better light shielding effect for the second switching element of the first switching element, and to expect a more precise operation of these.

Also, when the light shielding film is made of one of the above-mentioned materials where a relatively strong stress affects its inside when a tungsten silicide film is formed, the possibility of creating a crack increases. However, as described above, since the possibility is markedly reduced that a crack will be created in an interlayer insulating film or the like between the light shielding film and the second switching element in an aspect of the present invention, specific restrictions are not imposed on the light shielding film in that the light shielding film is made of the above-described material. That is, since the above-described material generally has an excellent light shielding effect, it is possible to enhance light shielding performance of the light shielding film.

In accordance with an aspect of the electro-optical device of the present invention, a pixel-division light shielding film is additionally formed to correspond to a region for forming the data line and the scanning line in the image display region, wherein the light shielding film being formed at the same time as the forming of the pixel-division light shielding film in the manufacturing step of the electro-optical device.

According to this aspect, the image division light shielding film formed in the image display region and the light shielding film according to an aspect of the present invention are formed at the same time. Therefore, it is possible to simplify the manufacturing process and to lower the manufacturing cost. Also, "at the same time" refers to the same as what is already described above.

In accordance with an aspect of the electro-optical device of the present invention, the distance between the light shielding film and the second switching element is 3000 nm or less.

According to this aspect, since the distance between the light shielding film and the second switching element, i.e., "the thickness" of an interlayer insulating film, a semiconductor layer composing the second switching element, and a gate insulating film which are disposed therebetween, is 3000 nm or less, which is relatively narrow, the above-described crack is more likely to be created. However, as described above, since the light shielding film and the second switching element are formed to overlap each other, at least partially, in the aspect of the present invention, even though "the thickness" is thin, the possibility is minor that a crack will be created in the interlayer insulating film or the like. In other words, according to an aspect of the present invention, since it is possible to achieve the miniaturization of the electro-optical device by decreasing the distance between the light shielding film and the second switching element, and it is also possible to reduce or prevent a crack from forming in the interlayer insulating film or the like, the above-mentioned effect of the aspect of the present invention can be obtained more effectively.

The electronic apparatus according to an aspect of the present invention includes the above-described electro-optical device of an aspect of the present invention (including the various aspects) in order to address the above-mentioned problems.

According to the electronic apparatus of an aspect of the present invention, since it includes the above-mentioned electro-optical device of an aspect of the present invention, it is possible to realize a variety of electronic apparatus, such as a projector, a liquid crystal TV, a cellular phone, an electronic note, a word processor, a viewfinder type or monitor direct-viewing-type video tape recorder, a workstation, a visual telephone, a POS terminal, or a touch panel, capable of preventing the breakdown of the second switching element in the peripheral region due to a crack and obtaining the precise operation of the second switching element and the entire apparatus.

These effects and other advantages of the invention will now be understood by reading the following illustrated exemplary embodiments.

BRIEF DESCRIPTION OF THE DRAWINGS

FIG. 10 is a comparative example corresponding to FIG. 8 (a sectional view taken substantially along the plane X2–X2' of FIG. 9);

DETAILED DESCRIPTION OF EXEMPLARY EMBODIMENTS

The exemplary embodiments of the present invention will now be set forth in conjunction with the accompanying figures, the following exemplary embodiments are configured to apply an electro-optical device according to an aspect of the present invention to a liquid crystal device.

Figure 1:
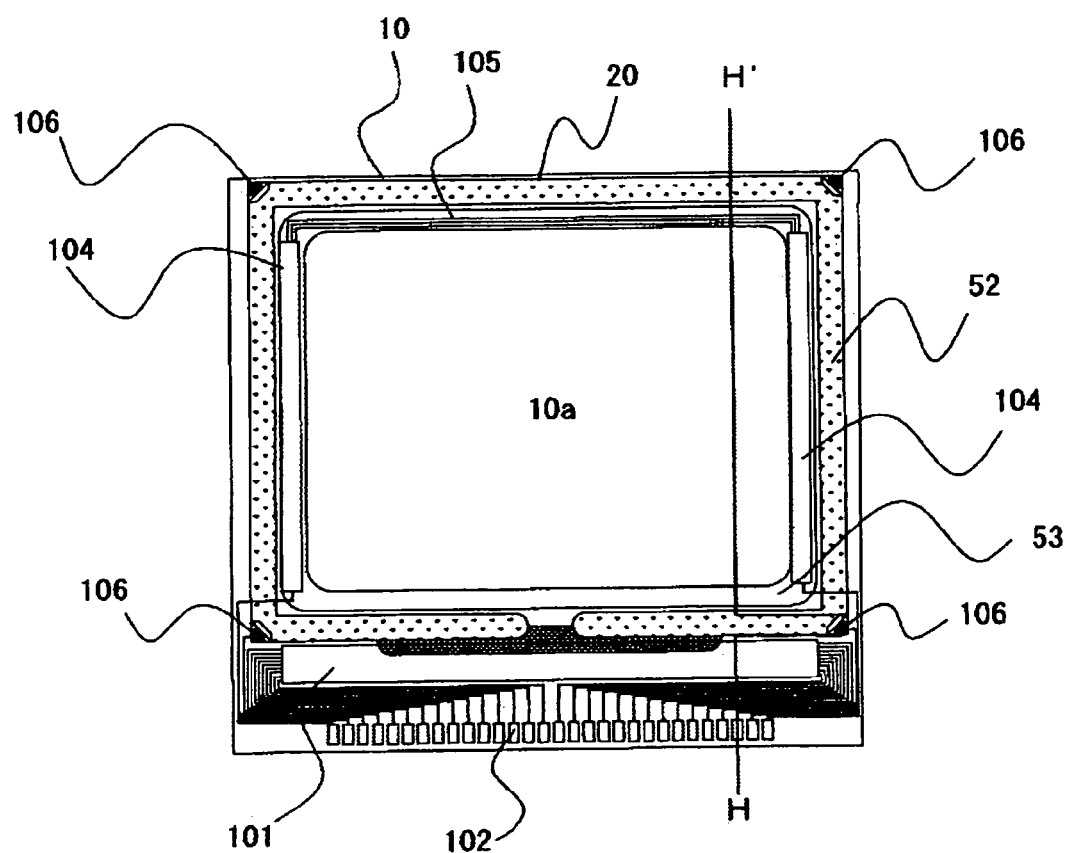
FIG. 1 is a plan view showing an electro-optical device according to an exemplary embodiment of the present invention.
Figure 2:
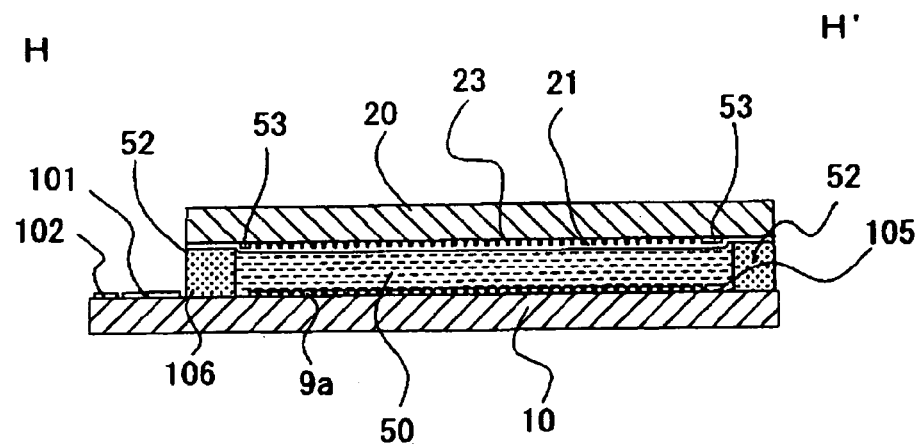
FIG. 2 is a sectional view taken substantially along the plane H–H' of FIG. 1.

First, reference will now be made to the configuration of an electro-optical device according to an exemplary embodiment of the present invention in conjunction with FIGS. 1 and 2. FIG. 1 is a plan view showing a TFT array substrate, together with each component formed thereon, seen from a counter substrate 20 side. FIG. 2 is a sectional view taken substantially along the plane H–H' of FIG. 1.

Referring to FIGS. 1 and 2, an electro-optical device according to the present exemplary embodiment is configured by disposing a TFT array substrate 10, which is an active matrix substrate, and a counter substrate 20 to face each other. A liquid crystal layer 50 is filled between the TFT array substrate 10 and a counter substrate 20. The TFT array substrate 10 and a counter substrate 20 are attached to each other by sealing material 52 provided in a seal region located in the vicinity of an image display region 10a that is defined as a region for forming the pixel electrode 9a and the TFT 30.

The sealing material 52 is made of, for example, an ultraviolet curable resin or a thermosetting resin, to attach both substrates together, which is cured by ultraviolet light or heating. Also, when the electro-optical device according to the present exemplary embodiment is, for instance, applied to a liquid crystal device for a projector which is small in size and enlarges the display, the gap material (spacer), such as glass fiber or glass bead is scattered in the sealing material 52 in order to space both substrates. Otherwise, when the electro-optical device is applied to the liquid crystal device for a liquid crystal display or a liquid crystal TV which is of a large size and displays at an equal magnification, the above-mentioned gap material may be included among the liquid crystal layer 50.

A frame light shielding film 53 defining a frame region of an image display region 10a is provided on the counter substrate 20 side, in parallel on the inside of a seal region 52 where sealing material 52 is disposed. However, the frame light shielding film 53 or a portion thereof may be provided as a built-in light shielding film on the TFT array substrate 10 side. In the present exemplary embodiment, there exists a peripheral region defining a periphery of the image display region 10a. In other words, especially when seen from the center of a TFT array substrate 10, a region from the frame light shielding film 53 to the outer circumference of a substrate is defined as a peripheral region in the present exemplary embodiment.

In the region located on the outside of a seal region 52 where sealing material 52 is disposed among the peripheral region, a data line driving circuit 101 and an external circuit connecting terminal 102 are provided along one side of a TFT array substrate 10. Also, a scanning line driving circuit 104 is provided to be covered with the frame light shielding film 53 along two sides adjacent to the one side. Also, in order to interconnect two scanning line driving circuits 104 provided on both sides of the image display region 10a, a plurality of wires 105 is provided to be covered with the frame light shielding film 53 along the remaining side of a TFT array substrate 10.

Also, vertical conduction materials 106 serving as vertical conduction terminals between both substrates are disposed in four corners of a counter substrate 20. On the other hand, in a TFT array substrate 10, vertical conduction terminals are provided in regions facing the corners. By these, the TFT array substrate 10 and the counter substrate 20 can be electrically connected to each other Referring to FIG. 2, on a TFT array substrate 10, an alignment film is formed on a pixel electrode 9a after a TFT for pixel switching, or a wire, such as a scanning line or data line is formed. Meanwhile, on the counter substrate 20, an alignment film is formed on the uppermost layer in addition to a counter electrode 21. Also, a liquid crystal layer 50 is made of, for example, a single kind of nematic liquid crystal or a mixture of a variety of kinds of nematic liquid crystal, and is in a predetermined alignment state between the pair of alignment films.

Further, on a TFT array substrate 10, there may be provided a sampling circuit (refer to the following description) to apply an image signal to a plurality of data lines 6a with predetermined timing, a precharge circuit to supply a precharge signal of a predetermined voltage level to each of a plurality of data lines 6a prior to the image signal, and a test circuit to check the quality or defects of the electro-optical device as well as the data line driving circuit 101 and the scanning line driving circuit 104 during manufacture or shipment.

Also, on the sides where projection light is incident in the counter substrate 20 and emitted light is emitted in the TFT array substrate 10, a polarizing film, a retardation film, and a polarizer are provided in a predetermined direction according to, for instance, operating modes, such as TN (twisted nematic) mode, VA (vertically aligned) mode, or PDLC (polymer dispersed liquid crystal) mode, or normally-white mode/normally-black mode, respectively.

Configuration of Pixel Portion

Figure 3:
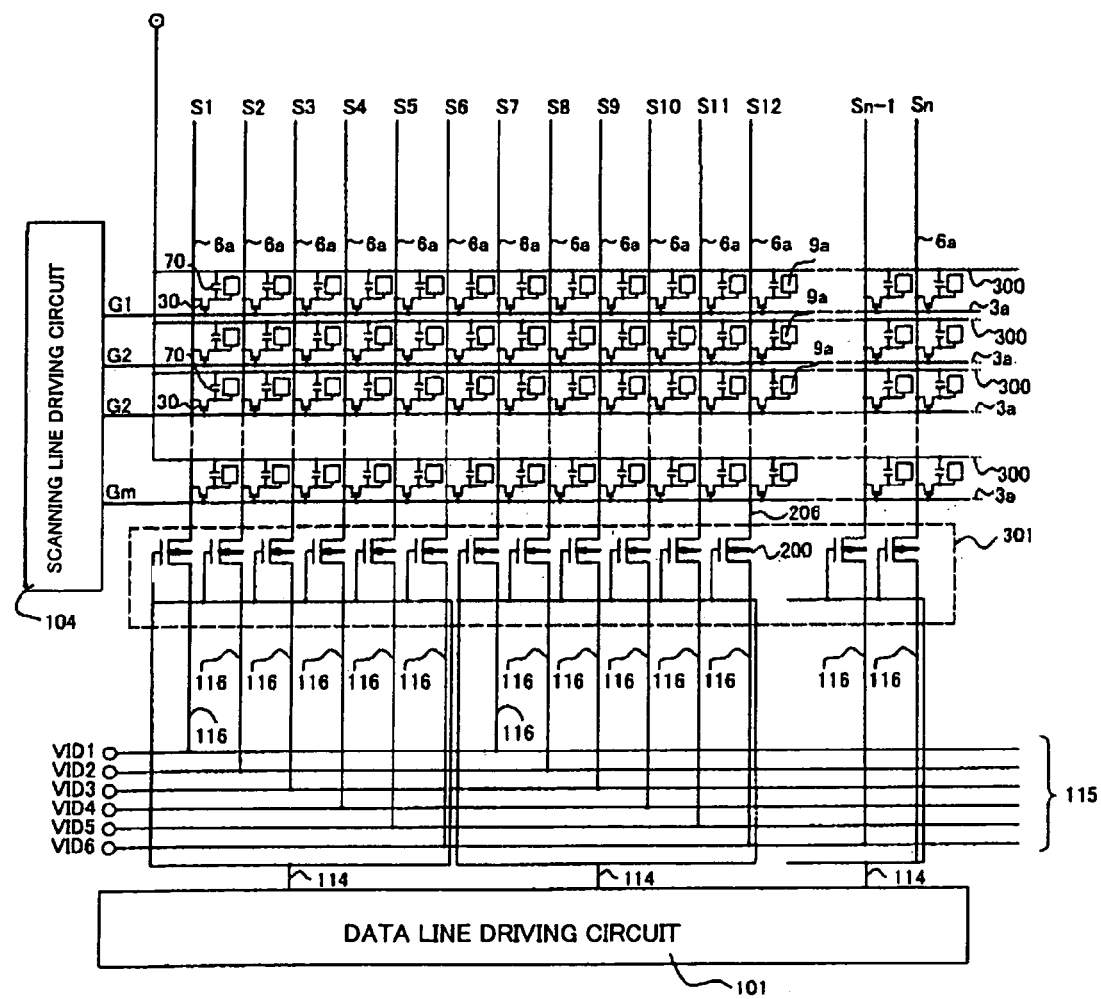
FIG. 3 is a circuit schematic showing an equivalent circuit of a variety of elements and wires provided in a plurality of pixels arranged in a matrix which composes an image display region in an electro-optical device according to an exemplary embodiment of the present invention.
Figure 4:
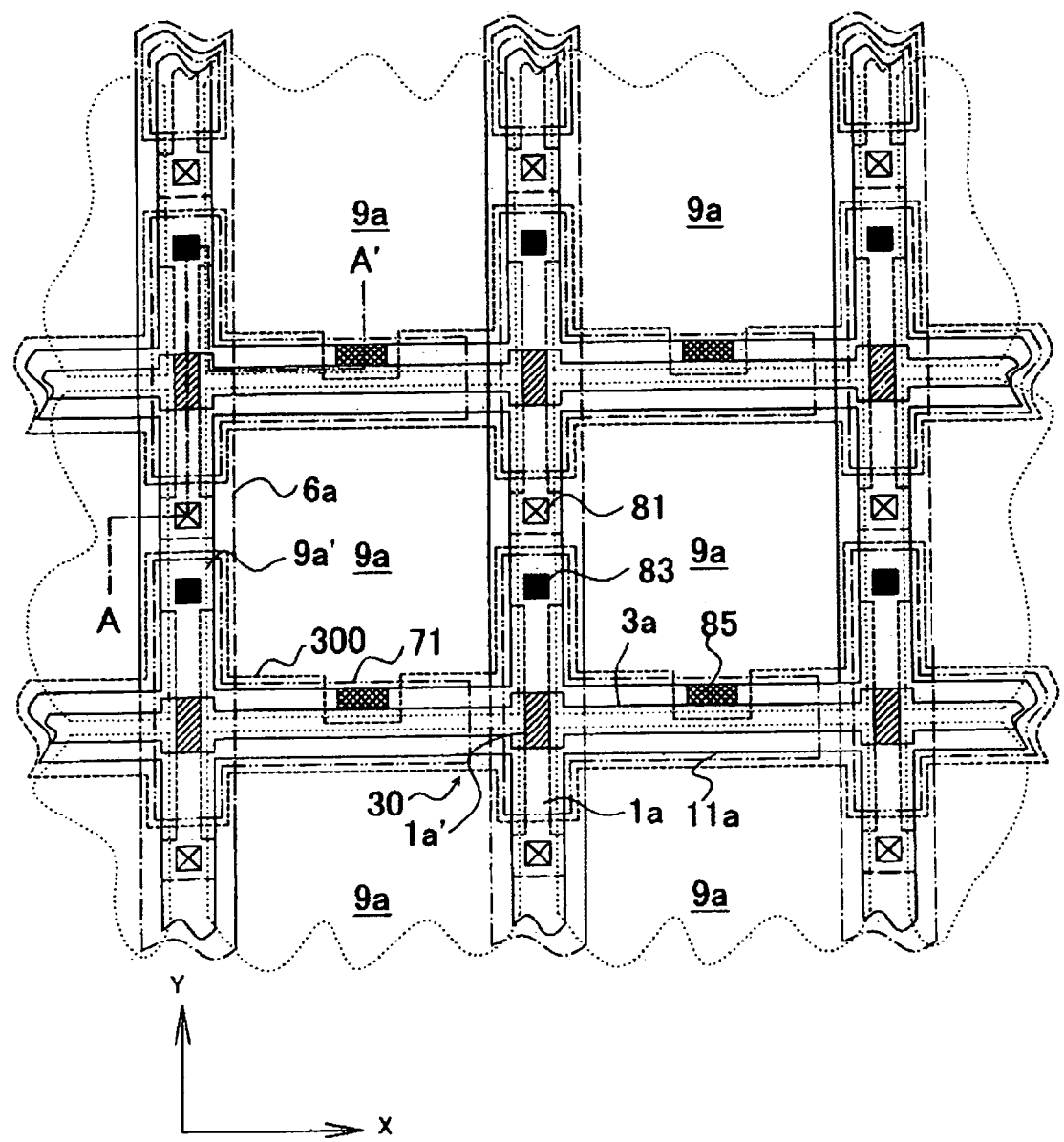
FIG. 4 is a plan view showing a plurality of pixel groups adjacent to one another of a TFT array substrate where a data line, a scanning line, and a pixel electrode are formed in an electro-optical device according to an exemplary embodiment of the present invention.
Figure 5:
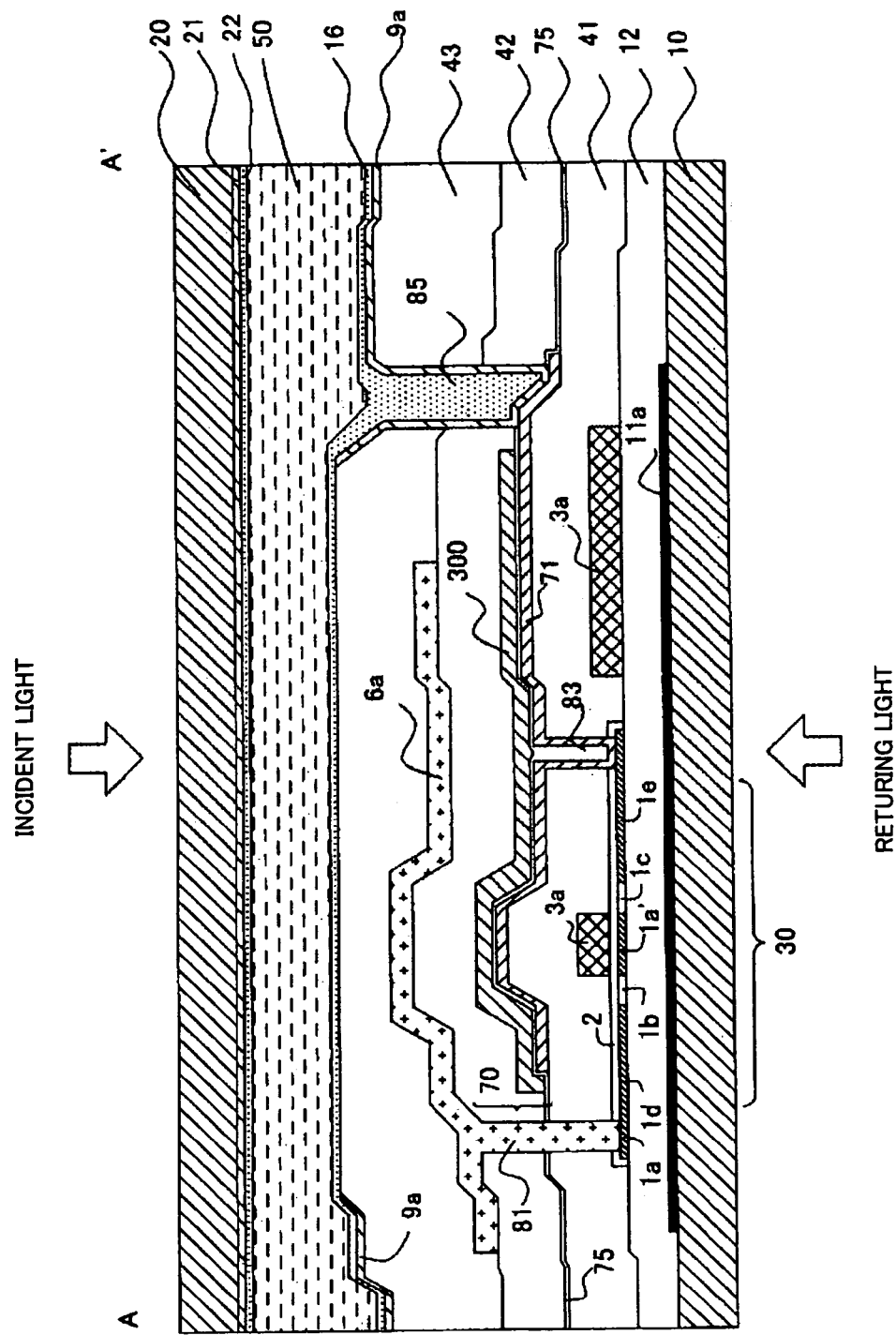
FIG. 5 is a sectional view taken substantially along the plane A–A' of FIG. 4.

Reference will now be made to the configuration of a pixel portion of an electro-optical device according to an embodiment of the present invention in conjunction with FIGS. 3 to 5. FIG. 3 shows an equivalent circuit of a variety of elements and wires provided in a plurality of pixels arranged in a matrix which composes an image display region of an electro-optical device. FIG. 4 is a plan view showing a plurality of pixel groups, adjacent to one another of a TFT array substrate where a data line, a scanning line, and a pixel electrode are formed. FIG. 5 is a sectional view taken substantially along the plane A–A' of FIG. 4. FIG. 5 is drawn on different scales with respect to each layer or component in order to make it possible to recognize each layer or component in the figure.

Referring to FIG. 3, in each of a plurality of pixels arranged in a matrix which composes an image display region of an electro-optical device according to the present exemplary embodiment, there are provided a pixel electrode 9a and a TFT 30 for switching control of the pixel electrode 9a, and a data line 6a to which an image signal is applied is electrically connected to a source of the TFT 30. While image signals S1, S2, . . . , and Sn written into data lines 6a may be sequentially applied in the line order, in the case of the present exemplary embodiment, especially image signals S1, S2, . . . , and Sn are serial-parallel developed in N parallel image signals, and are configured to make it possible to apply N image signal lines 115 to adjacent N data lines 6a by the group.

In a peripheral region other than an image display region, one end of a data line 6a (a lower end in FIG. 3) is connected to a circuit element 200 for switching which composes a sampling circuit 301. An n-channel, p-channel, or CMOS type TFT may be included as examples of the circuit element for switching (hereinafter, the circuit element 200 for switching indicated in FIG. 3 is referred to as a TFT 200). In this case, a drain of the TFT 200 is connected to a lower end of the data line 6a in FIG. 3 via a lead wire 206, a source of the TFT 200 is connected to an image signal line 115 via a lead wire 116, and a gate of the TFT 200 is connected to a sampling circuit driving signal line 114 which is connected to a data line driving circuit 101. Image signals S1, S2, . . . , and Sn on image signal lines 115 are configured to be sampled by a sampling circuit 301 as a sampling signal is applied from a data line driving circuit 101 via a sampling circuit driving signal line 114 to be applied to each data line 6a.

In this way, image signals S1, S2, . . . , and Sn written into data lines 6a may be sequentially applied in the line order, or may be applied to a plurality of adjacent data lines 6a by the group. In the present exemplary embodiment, as shown in FIG. 3, six data lines 6a are set to one group and image signals are simultaneously applied to these data lines.

A gate of a TFT 30 is electrically connected to a scanning line 3a, and scanning signals G1, G2, . . . , and Gm are sequentially applied in the shape of a pulse to scanning lines 3a in the line order with predetermined timing. A pixel electrode 9a is electrically connected to a drain of a TFT 30, and image signals S1, S2, . . . , and Sn applied from a data line 6a are written with predetermined timing by blocking a switch of a TFT 30 that is a switching element only for a certain period of time.

Image signals S1, S2, . . . , and Sn of a predetermined level written into liquid crystal as an example of electro-optical material via a pixel electrode 9a are retained between counter electrode formed in a counter substrate for a certain period of time. Liquid crystal modulates light and makes grayscale display possible by an alteration in alignment or order of the molecule group by an applied voltage level. Normally-white mode causes transmittance to incident light to be reduced depending on the voltage applied by the pixel, and normally-black mode causes transmittance to incident light to be increased depending on the voltage applied by the pixel, whereby, on the whole, the light having contrast depending on an image signal is emitted from the electro-optical device.

In order to reduce or prevent the retained image signal from leaking, a storage capacitor 70 is added parallel to a liquid crystal capacitor formed between a pixel electrode 9a and a counter electrode. The storage capacitor 70 is provided parallel to a scanning line 3a, and includes a capacitive electrode on the fixed potential side and a capacitor line 300 which is fixed to a constant potential.

Reference will now be made to a practical configuration of an electro-optical device where the above-described circuit operation is realized by the data line 6a, the scanning line 3a, and the TFT 30 in conjunction with FIGS. 4 and 5.

First, as shown in FIG. 5 which is a sectional view taken substantially along the plane A–A' of FIG. 4, the electro-optical device according to the present exemplary embodiment includes a transparent TFT array substrate 10 and a transparent counter substrate 20 disposed to face the TFT array substrate 10. The TFT array substrate 10 is made of, for example, a quartz substrate, a glass substrate, or a silicon substrate, and the counter substrate 20 is made of, for example, a glass substrate or a quartz substrate.

As shown in FIG. 5, a pixel electrode 9a is provided in the TFT array substrate 10, and there is provided thereon an alignment film 16 which is subjected to a predetermined alignment process, such as rubbing. The pixel electrode 9a is made of, for example, a transparent conductive film, such as ITO (indium tin oxide) film. On the other hand, a counter electrode 21 is provided over the entire surface of the counter substrate 20, and there is provided on its downside an alignment film 22 which is subjected to a predetermined alignment process, such as rubbing. The counter electrode 21 is made of, for example, a transparent conductive film, such as an ITO film like the above-mentioned pixel electrode 9a, and the alignment films 16 and 22 are made of, for example, a transparent organic film, such as a polyimide film. Between the TFT array substrate 10 and the counter substrate 20 which are disposed to face each other in this way, a liquid crystal layer 50 is formed by filling electro-optical material, such as liquid crystal, in a space surrounded by the above-described sealing material (see FIGS. 1 and 2). The liquid crystal layer 50 has a predetermined alignment state by alignment films 16 and 22, with no electric field applied from a pixel electrode 9a. The liquid crystal layer 50 is made of electro-optical material formed by, for example, a single kind of nematic liquid crystal or a mixture of a variety of kinds of nematic liquid crystal. The sealing material is an adhesive made of, for example, an ultraviolet curable resin or thermosetting resin for attaching the TFT array substrate 10 and the counter substrate 20 together in their circumference, and is mixed with a spacer, such as glass fiber or glass bead, in order to space both substrates out.

Referring to FIG. 4, a plurality of pixel electrodes 9a is arranged on a TFT array substrate 10 in a matrix (its profile is indicated by the dotted line 9a'), and a data line 6a and a scanning line 3a are provided along the longitudinal and transverse boundaries of the pixel electrode 9a, respectively. A data line 6a is made of, for example, a metal film, such as an aluminum film or an alloy film, and a scanning line 3a is made of, for example, a conductive polysilicon film. A scanning line 3a is disposed to face a channel region 1a', indicated with a rightly upwardly slanted oblique region among a semiconductor layer 1a in the figure, and the scanning line 3a functions as a gate electrode. That is, TFTs 30 for pixel switching where a main line portion of a scanning line 3a is disposed as a gate electrode to face a channel region 1a' are provided at the intersections of scanning lines 3a and data lines 6a respectively.

As shown in FIG. 5, a TFT 30 is of the structure of a LDD (lightly doped drain), and includes as its components a scanning line 3a which functions as a gate electrode, a channel region 1a' of a semiconductor layer 1a which is made of, for example, a polysilicon film and where the channel is formed by an electric field from a scanning line 3a, an insulating film 2 including a gate insulating film which insulates a scanning line 3a from a semiconductor layer 1a, and a low concentration source region 1b, a low concentration drain region 1c, a high concentration source region 1d, and a high concentration drain region 1e in a semiconductor layer 1a.

Also, as shown in FIG. 5, while a TFT 30 is preferably of the structure of a LDD, it may have an offset structure where an impurity is not injected to a low concentration source region 1b and a low concentration drain region 1c, or it may have a self-aligned TFT where impurity of high concentration is injected using a gate electrode formed of a portion of a scanning line 3a as a mask and a high concentration source region and a high concentration drain region are formed in a self-aligned manner. Also, although the present exemplary embodiment has employed a single-gate structure where only a single-gate electrode of a TFT 30 for pixel switching is disposed between a high concentration source region 1d and a high concentration drain region 1e, two or more gate electrodes may be disposed between them. If a TFT is configured with the structure of two, three, or more gates, it is possible to reduce or prevent current from leaking in the junction between a channel and source and drain regions, thereby reducing current during OFF. Moreover, a semiconductor layer 1a composing a TFT 30 may be a monocrystal or a polycrystal layer. A related art method, such as a junction method, may be employed for the formation of a monocrystal layer. It is possible to obtain a high performance peripheral circuit by forming a semiconductor layer 1a of a monocrystal layer.

Meanwhile, referring to FIG. 5, the storage capacitor 70 is formed by disposing to face each other a relay layer 71 as a capacitor electrode on a pixel potential side connected to a high concentration drain region 1e of a TFT 30 and a pixel electrode 9a, and a portion of capacitor line 300 as a capacitor electrode on a fixed potential side, with a dielectric film 75 therebetween. Owing to the storage capacitor 70, it is possible to remarkably enhance the potential retaining property in a pixel electrode 9a.

The relay layer 71 is made of, for example, a conductive polysilicon film, and functions as a capacitor electrode on a pixel potential side. However, the relay layer 71 may be formed of a single layer film or a multilayer film including metal or alloy, similarly to a capacitor line 300 to be described later. The relay layer 71 functions not only as a capacitor electrode on a pixel potential side but also as a relaying device, which relays to connect to a pixel electrode 9a and a high concentration drain region 1e of a TFT 30 via contact holes 83 and 85.

A capacitor line 300 is made of, for example, a conductive film including metal or alloy, and functions as a capacitor electrode on a fixed potential side. The capacitor line 300 is formed to overlap in a region for forming a scanning line 3a in plan view as shown in FIG. 4. Specifically, the capacitor line 300 includes a main line portion which extends along a scanning line 3a, a protrusion which is projected upwardly along a data line 6a from each portion intersecting with a data line 6a in the figure, and a narrow portion corresponding to a contact hole 85. The protrusion contributes to the increasing of a region for forming a storage capacitor 70 by utilizing a region over a scanning line 3a and a region under a data line 6a. Preferably, the capacitor line 300 is provided to extend from an image display region 10a in which a pixel electrode 9a is disposed to its surrounding, and electrically connected to a constant voltage source to become a fixed potential. Such a constant voltage source may be a positive or negative constant voltage source supplied to a data line driving circuit 101, or a constant voltage source supplied to a counter electrode 21 of a counter substrate 20.

As shown in FIG. 5, a dielectric film 75 is made of, for example, a relatively thin silicon oxide film or silicon nitride film, such as HTO (high temperature oxide) film or LTO (low temperature oxide) film having a thickness of between approximately 5 and 200 nm. In terms of the increase of a storage capacitor 70, as long as the reliability of film can be sufficiently obtained, the thinner the dielectric film 75, the better.

Referring to FIGS. 4 and 5, additionally there is provided a lower light shielding film 11a which corresponds to an example of "pixel-divison light shielding film" described in an aspect of the present invention on a lower side of the TFT 30. The lower light shielding film 11a is patterned in a lattice shape, which defines a passage region of each pixel. The passage region is also defined by a data line 6a of FIG. 4 and a capacitor line 300 formed to cross this data line. Further, the lower light shielding film 11a is preferably provided to extend from an image display region to its surrounding and connect to a constant voltage source in order to reduce or prevent its potential variation from affecting the TFT 30, like the case of the above-mentioned capacitor line 300.

Also, a basic insulating film 12 is provided on a lower side of the TFT 30. The basic insulating film 12 functions not only to insulate a TFT 30 from a lower light shielding film 11a, but also to reduce or prevent the characteristic of a TFT 30 for pixel switching from changing due to the roughness caused by polishing of a surface of a TFT array substrate 10 or the contaminant remaining after cleaning because of the fact that basic insulating film is formed over the entire surface of the TFT array substrate 10.

Additionally, there is provided on a scanning line 3a a first interlayer insulating film 41 where a contact hole 81 leading to a high concentration source region 1d and a contact hole 83 leading to a high concentration drain region 1e are opened respectively. A relay layer 71 and a capacitor line 300 are provided on a first interlayer insulating film 41, and there is provided thereon a second interlayer insulating film 42 where a contact hole 81 leading to a high concentration source region 1d and a contact hole 85 leading to a relay layer 71 are opened respectively. Additionally, a data line 6a is provided on a second interlayer insulating film 42, and there is provided thereon a third interlayer insulating film 43 where a contact hole 85 leading to a relay layer 71 is formed.

Furthermore, in the present exemplary embodiment, it may be intended to activate ions implanted into the polysilicon film composing the semiconductor layer 1a or scanning line 3a, by performing the firing of approximately 1000° C. to the first interlayer insulating film 41. On the other hand, it may be intended to reduce the stress occurring in the vicinity of the interface of the capacitor line 300 by not performing the above-mentioned firing to the second interlayer insulating film 42. Also, the surface of a third interlayer insulating film 43 is planarized by a CMP (chemical mechanical polishing) process, so the alignment defect of a liquid crystal layer 50, caused by step difference by various wires or elements existing on the lower side, is reduced. However, instead of or in addition to the planarization process to the third interlayer insulating layer 43 in this way, a planarization process may be performed by forming a recess in at least one of the TFT array substrate 10, the basic insulating film 12, the first interlayer insulating film 41, and the second interlayer insulating film 42 and then burying the wires such as the data line 6a or a TFT 30.

Configuration of Peripheral Region

Figure 6:
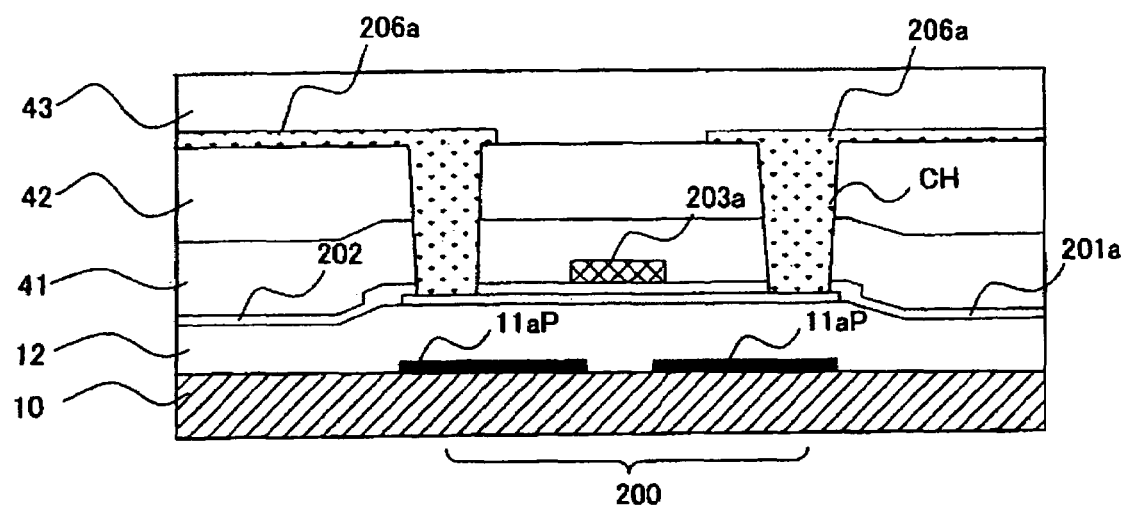
FIG. 6 is a sectional view showing the configuration of TFTs or wires formed in a peripheral region of an electro-optical device according to an exemplary embodiment of the present invention.

Reference will now be made to configuration of a peripheral region of an electro-optical device according to an aspect of the present invention in conjunction with FIG. 6. FIG. 6 is a sectional view showing the configuration of a TFT 200 or the like provided in a peripheral region which defines the surrounding area of the above-described image display region.

Referring to FIG. 6, a TFT 200 or a wire 206a is formed in a peripheral region. The TFT 200 corresponds to, for example, a TFT 200 composing a sampling circuit 301 shown in FIG. 3, and the wire 206a corresponds to a lead wire 206 or 116. Or, a circuit which is provided between a scanning line driving circuit 104 and scanning lines G1, G2, . . . , and Gm, and has the function of controlling the timing for applying a scanning signal, e.g., the enable function, may be configured by using a TFT. When such a circuit is provided, the circuit of FIG. 6 has a TFT 200, and a wire 206a corresponds to a scanning line Gm.

The TFT 200 and the wire 206a are formed at the same time as the forming of various elements which are explained referring to FIG. 5. That is, the TFT 200 of FIG. 6 includes a semiconductor layer 201a, a gate insulating film 202, and a gate electrode film 203a, the semiconductor layer 201a being formed at the same time as the forming of a semiconductor layer 1a of FIG. 5, the gate insulating film 202 being formed at the same time as the forming of an insulating film 2 of FIG. 5, and the gate electrode film 203a being formed at the same time as the forming of a scanning line 3a of FIG. 5. Although not shown, similarly to a semiconductor layer 1a of FIG. 5, a channel region, a source region, and a drain region are formed in the semiconductor layer 201a of FIG. 6 by introducing impurity.

Referring to FIG. 6, a wire 206a electrically connected to the semiconductor layer 201a is formed, the wire 206a being formed at the same time as the forming of the data line 6a of FIG. 5. Moreover, the wire 206a and the semiconductor layer 1a are electrically connected to each other via a contact hole CH, the contact hole CH being formed at the same time as the forming of the contact hole 81 of FIG. 5. In addition, it goes without saying that each interlayer insulating film of FIG. 6 is formed at the same time as the forming of each interlayer insulating film of FIG. 5 (both are indicated by the same reference numerals to that effect).

In this way, according to the present exemplary embodiment, since various elements of FIG. 5 and various elements of FIG. 6 are formed simultaneously, the manufacture of one element refers to the manufacture of corresponding other element, whereby it is possible to simplify the manufacturing process or to lower the manufacturing cost.

In the present exemplary embodiment, especially in the configuration of such a peripheral region, a light shielding film 11aP is formed on the lower side of a TFT 200 in FIG. 6. The light shielding film 11aP is formed at the same time as the forming of a lower light shielding film 11a of FIG. 5. In this way, in the present exemplary embodiment, it is possible to reduce or prevent a light incident from the lower side of a TFT array substrate 10 in the drawing from reaching a TFT 200, especially its semiconductor layer 201a, by forming a light shielding film 11aP on the lower side of a TFT 200. Therefore, it is possible to reduce or prevent light leak current from generating, and to obtain a precise operation of the related TFT 200. Additionally, the above-mentioned light incident from the lower side of the TFT array substrate 10 in the figure is referred to as "returned light."

The progress of returned light reflected on a wire 206a or the like which is formed in the vicinity of an image display region 10a can be blocked by such a light shielding film 11aP. In this case, if the progress of the light is not blocked, it seems as if a light component which does not contribute to configuration of the image emitted with the outer part of an image display region 10a as its starting point, whereby the image is degraded with the result that a dim image is illuminated in the vicinity of the image. However, since the progress of a reflected light of the returned light can be blocked by the light shielding film 11aP of the present exemplary embodiment as described above, the above-described problem does not arise. Also, the above-described problem becomes more serious when reflection occurs by a wire 206a or the like formed in the vicinity of the image display region 10a, especially in the range of about 400 μm from the edge of the image display region 10a (e.g., a wire or the like composing a sampling circuit 301 shown in FIG. 1), or when the wire 206a or the like is made of material with a relatively high reflectance, such as aluminum. Therefore, in this case, if a light shielding film 11aP is formed to correspond to the related portions, the above-mentioned effects show more markedly.

Figure 7:
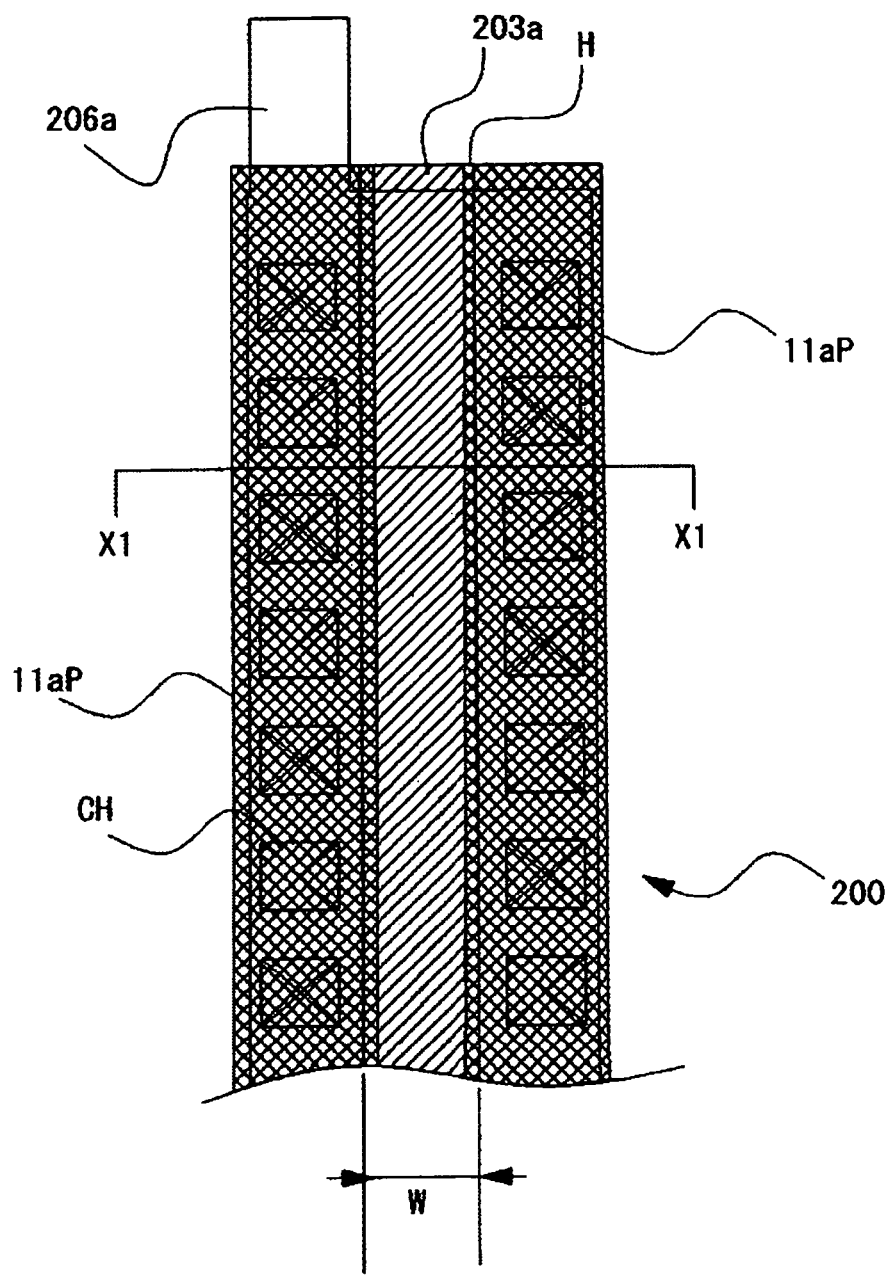
FIG. 7 is a plan view showing a TFT and a light shielding film formed in the lower layer of the TFT in a peripheral region.
Figure 8:
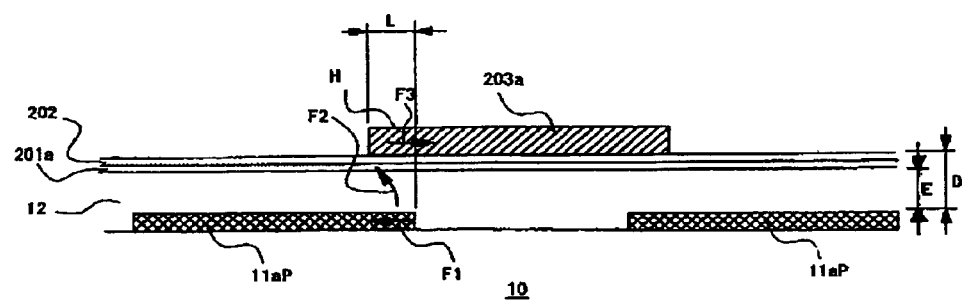
FIG. 8 is a sectional view taken substantially along the plane X1–X1' of FIG. 7.

Reference will now be made in detail to the configuration and effect of the light shielding film 11aP, the TFT 200, or the gate electrode film 203a in conjunction with FIGS. 7 and 8. FIG. 7 is a plan view showing a TFT 200, a light shielding film 11aP formed in the lower layer of the TFT 200, etc., and FIG. 8 is a sectional view taken substantially along the plane X1–X1' of FIG. 7. FIG. 8 is an enlarged sectional view of only the gate electrode film 203a and the light shielding film 11aP of FIG. 6.

Referring to FIG. 7, a TFT 200 includes an approximately rectangular gate electrode film 203a in plan view. Meanwhile, like the gate electrode film 203a, a light shielding film 11aP also includes the shape of a substantially rectangle in plan view. Further, the light shielding film 11aP is not formed in the lower portion of the gate electrode film 203a, i.e., the portion corresponding to a channel region of the semiconductor layer 201a but formed only in the portions corresponding to a source region and a drain region which are located on both sides of the channel region. In other words, the light shielding film 11aP is divided making the portion corresponding to the channel region a boundary. The gate electrode film 203a and the light shielding film 11aP overlap each other in the long side portion of the rectangle as shown in FIG. 7 (refer to H in FIGS. 7 and 8). In addition, the degree of overlapping according to the present exemplary embodiment is indicated by the mark L of FIG. 8 when the channel width W of FIG. 7 is approximately 600 μm, and the distance L is preferably, for example, about 0.5 μm long.

As described above, the light shielding film 11aP and the gate electrode film 203a are formed at the same time as the forming of the lower light shielding film 11a and the scanning line 3a in the image display region. Therefore, both are made of the same material. With reference to this fact, the light shielding film 11aP according to the present exemplary embodiment is preferably made of, for example, tungsten silicide in order to obtain the light shielding effect on the TFT 200 more effectively.

The distance between the light shielding film 11aP and the gate electrode film 203a, i.e., the entire thickness D (see FIG. 8) of the basic insulating film 12, the gate insulating film 202, and the semiconductor layer 201a is preferably about 3000 nm or less, or more preferably about 2000 nm or less, considering the miniaturization of the electro-optical device, the reliable insulation by the basic insulating film 12, the optimal time period of film formation, and the thickness of the semiconductor layer 201a and the gate insulating film 202 for the appropriate operation of the TFT 200. In a variation, the thickness E (see FIG. 8) of the basic insulating film 12 between the light shielding film 11aP and the semiconductor layer 201a is about 3000 nm or less.

Figure 9:
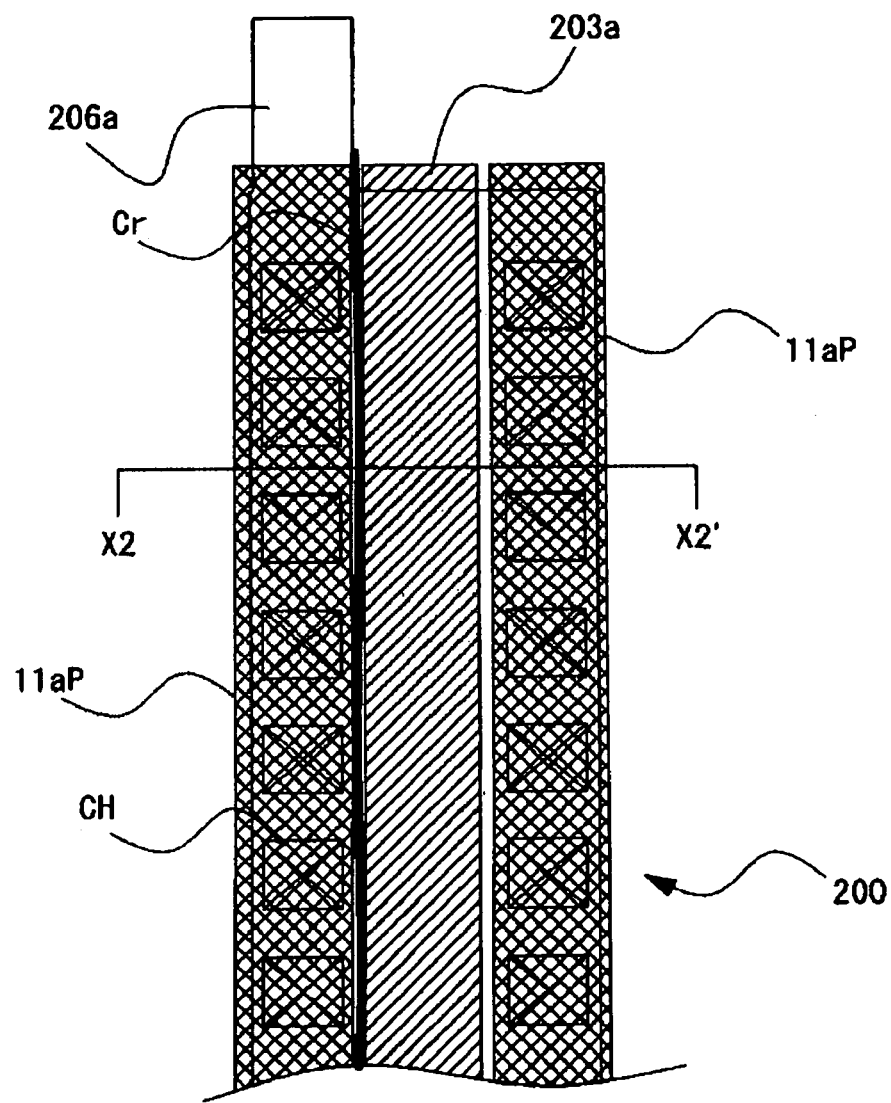
FIG. 9 is a comparative example corresponding to FIG. 7.
Figure 11A:
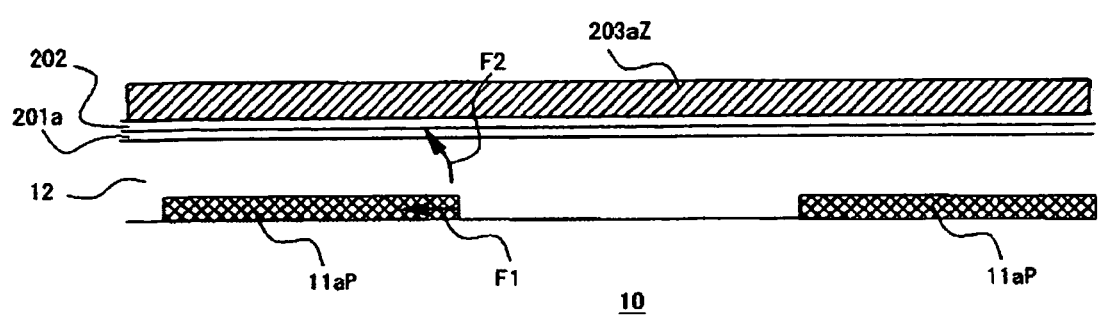
FIGS. 11(A) and 11(B) are schematics for illustrating how the crack Cr shown in FIGS. 9 and 10 is created.
Figure 11B:
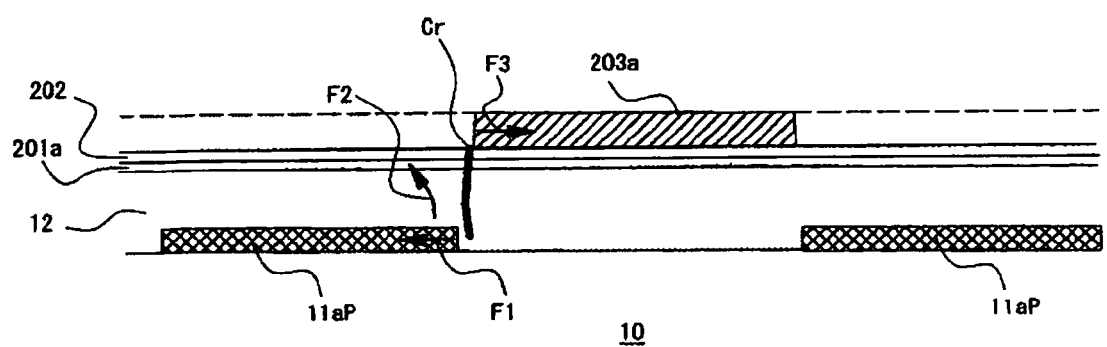

The following effects can be obtained by the light shielding film 11aP thus configured. That is, by overlapping a gate electrode film 203a and a light shielding film 11aP as shown in FIGS. 6 or 7 and 8, the possibility is markedly reduced that a crack will be created in the basic insulating film 12, the gate insulating film 202, or the semiconductor layer 201a which is located between them. The reason for obtaining such an effect will be now set forth in conjunction with FIGS. 9 to 11. FIGS. 9 and 10 are comparative examples corresponding to FIGS. 7 and 8 respectively, and FIGS. 11(A) and 11(B) are schematics illustrating how the crack Cr shown in FIGS. 9 and 10 is created. Also, various elements shown in FIGS. 9 to 11 which perform substantially the same functions as those in FIGS. 7 and 8 are indicated by the same reference numerals for convenience of explanation.

Referring to FIGS. 9 and 10, the gate electrode film 203a and the light shielding film 11aP do not overlap each other in plan view, unlike in FIGS. 7 and 8. Moreover, both edges are formed to be on almost the same line. In this case, the possibility is increased that a crack Cr shown in the figure will be created in the edges of the gate electrode film 203a and the light shielding film 11aP. Such a problem is assumed to occur in the following situation.

First, a gate electrode film 203a and a light shielding film 11aP are typically formed through the formation of the respective precursor films and the patterning process to the precursor films (photolithography and etching process). In this case, first, by the formation of the precursor film of the light shielding film 11aP and the patterning process to the precursor film, for instance, internal stress F1 as shown in the figure affects the light shielding film 11aP, which is fully formed, as shown in FIG. 11(A). Internal stress F1 affects the basic insulating film 12, the semiconductor layer 201a, and the gate insulating film 202 which are formed on the light shielding film 11aP (for example, see reference numeral F2 in FIG. 11(A)). That is, internal stresses F1 and F2 may increase when tungsten silicide is selected as the material of the light shielding film 11aP as described above. Secondly, as shown in FIG. 11(A), the precursor film 203aZ of the gate electrode film 203a is formed. The precursor film 203aZ functions to suppress internal stress F2, as can be seen from the figure. Finally, the precursor film 203aZ is removed by etching except for a predetermined region as shown in FIG. 11(B) (refer to the broken line in the figure). Then, the inside of the gate electrode film 203a, which is now fully formed, is affected by internal stress F3 as shown in the figure, and internal stress F2 seems to be released. When the internal stresses F1 and F2 and the internal stress F3, which seem contrary to each other, the edge of the gate electrode film 203a and the edge of the light shielding film 11aP are formed to be on the same line in plan view, each stress F1, F2, and F3 affects the edges intensively. Owing to this, it is assumed that the possibility is extremely increased that a crack Cr shown in FIG. 11(B) or FIGS. 10 and 9 will be created. At this time, as can be seen from the above description, while the possibility of creating a crack Cr is most increased when the edge of the gate electrode film 203a and the edge of the light shielding film 11aP are formed to be on the same line as shown in FIG. 11(B) or FIGS. 9 and 10, it may be assumed that the same phenomenon occurs when both are formed not to overlap each other in plan view, even though there is a difference of degree (when both are formed at a considerable distance, the above-mentioned problem does not arise but it is impossible to shield the semiconductor layer 201a by the light shielding film 11aP). If a crack Cr is created, the gate insulating film 202 or the semiconductor layer 201a is damaged as shown in each figure, which causes the TFT 200 itself to break in a serious case.

However, the present exemplary embodiment does not suffer the above-mentioned problems, because the gate electrode film 203a and the light shielding film 11aP are formed to overlap each other in plan view, as already has been described. In this case, as also shown in FIG. 8, it is possible to suppress the release of internal stress F2 by the gate electrode film 203a as shown in FIG. 11, and the possibility that the acting points of internal stresses F1, F2 and F3 are concentrated on a specific point is reduced.

Therefore, since the possibility can be extremely reduced that a crack will be created in the basic insulating film 12, the gate insulating film 202, or the semiconductor layer 201a which are provided between a gate electrode film 203a and a light shielding film 11aP according to the present exemplary embodiment, it is possible to obtain a precise operation of the TFT 200. Also, since the overlapped portion of the gate electrode film 203a and the light shielding film 11aP is extended over a relatively long distance as shown in FIG. 7 in the present exemplary embodiment, it is possible to obtain the above-mentioned effects for the overlapped distance.

Although the present exemplary embodiment has disclosed only the relation between a light shielding film 11aP provided in a TFT200 which is formed in a peripheral region and a gate electrode film 203a of the TFT 200, the present invention is not limited to such configuration. For instance, the above-mentioned relation can be applied to the relation between a TFT 30 formed in an image display region 10a or a scanning line 3a portion which functions as a gate electrode of the TFT 30 and the lower light shielding film 11a. Also, a TFT 200 formed in a peripheral region is provided between a sampling circuit 301 or a scanning line driving circuit 104 and scanning lines G1, G2, . . . , and Gm to control the timing for applying the scanning signal, and may be, for example, the circuit having the enable-function as described above.

Electronic Apparatus

Figure 12:
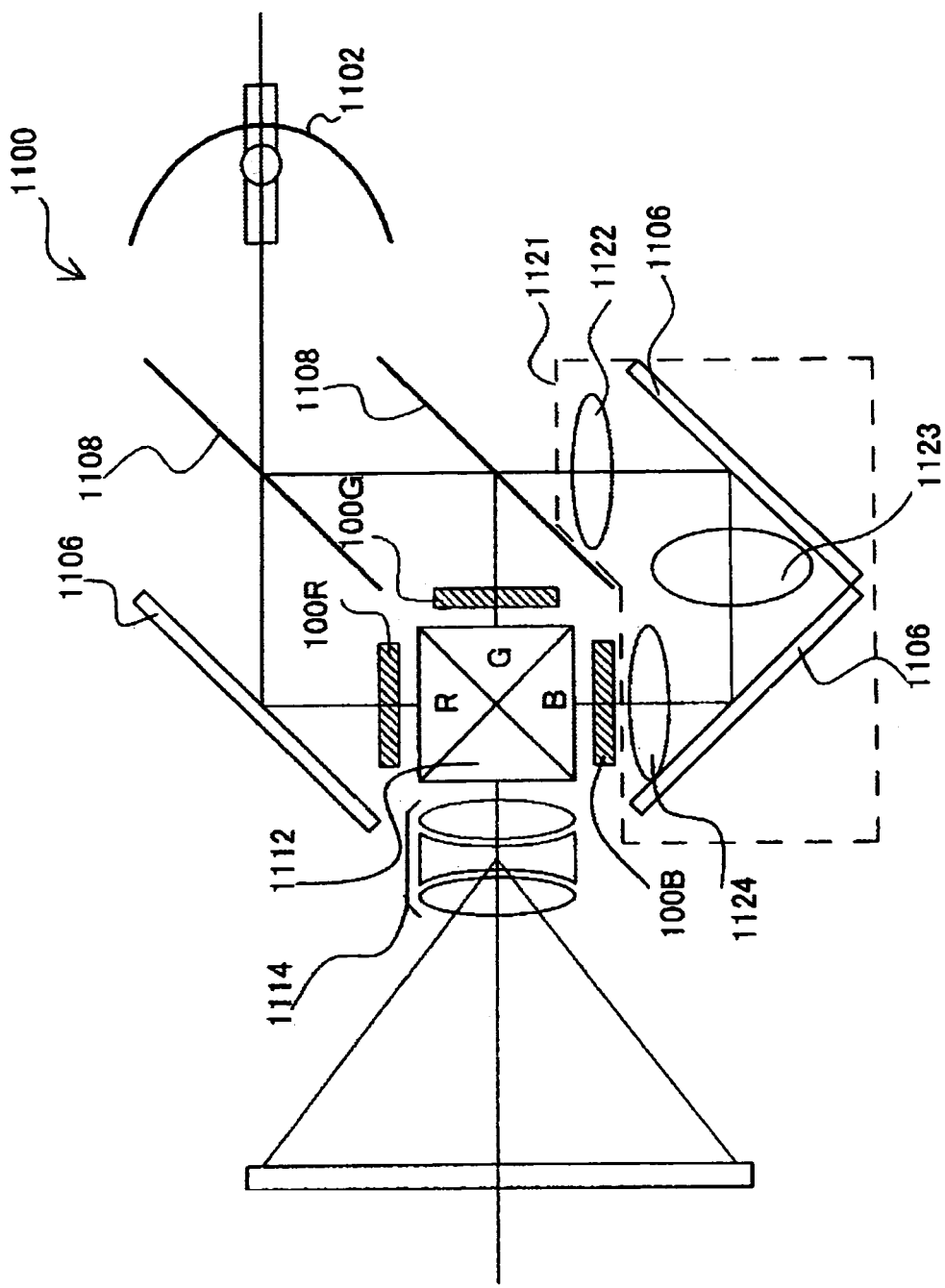
FIG. 12 is a plan view showing a projection display according to an exemplary embodiment of the present invention.

Reference will now be made to the exemplary embodiment regarding the entire configuration, especially the optical configuration, of a projection color display that is an example of an electronic apparatus using the above-described electro-optical device as a light valve. FIG. 12 is a schematic sectional view of a projection color display.

Referring to FIG. 12, a liquid crystal projector 1100 that is an example of a projection color display according to the present exemplary embodiment includes three liquid crystal modules including a liquid crystal device where a driving circuit is mounted on a TFT array substrate, each module being used as a light valve 100R, 100G, or 100B for RGB. In the liquid crystal projector 1100, when the projection light is emitted from a lamp unit 1102 of white light source, such as a metal halide lamp, it can be divided into the light components R, G, and B corresponding to three primary colors of RGB by three sheets of mirrors 1106 and two sheets of dichroic mirror 1108, each light component being guided to the light valve 100R, 100G, or 100B corresponding to each color. At this time, especially, the light component B is guided through a relay lens system 1121 including an incident lens 1122, a relay lens 1123, and an emit lens 1124 in order to reduce or prevent light loss caused by the long light path. The light components corresponding to the three primary colors modulated by the light valves 100R, 100G, and 100B, respectively, are synthesized again by the dichroic prism 1112 and then projected as color images to the screen 1120 through the projection lens 1114.

In such a projection color display, the light valves 100R and 100B are disposed to face each other with the dichroic prism 1112 therebetween. Therefore, light emitted from one light valve 100R (or 100B) is incident on the other light valve 100B (or 100R) more directly from the direction opposite to the direction from which the projection light is originally incident.

However, as described above, since the light shielding film 11aP is formed to correspond to the TFT 200 in the present exemplary embodiment, the progress of the so-called "returned light" is blocked by the light shielding film 11aP before reaching the TFT 200. By doing this, it is possible to reduce or prevent light leak current from generating in a semiconductor layer 201a of a TFT 200, and to reduce or prevent the operation of the TFT 200 and the light valves 100R, 100G, and 100B from malfunctioning. Also, as described above in conjunction with FIGS. 7 and 8 in the present exemplary embodiment, since the light shielding film 11aP is formed to overlap the gate electrode film 202, it is possible to reduce or prevent the operation of the light valves 100R, 100G; and 100B from malfunctioning and creating a crack in the basic insulating film 12 and the semiconductor layer 201a between the light shielding film 11aP and the gate electrode film 202.

The present invention is not limited to the foregoing exemplary embodiments, and various modification and variations may be made, without departing from the spirit or scope of the present invention, which ate inferable from the claims and the description. Further, the electro-optical device and the electronic apparatus where such variations are made also fall within the technical scope of the present invention.

What is claimed is:

1. An electro-optical device, comprising:
a substrate having an image display region and a peripheral region surrounding the image display region;
a data line;
a scanning line extending in a direction crossing the data line;
a first switching element disposed in the image display region, the first switching element being applied with a scanning signal by the scanning line, the first switching element including a semiconductor layer having a source, a drain, and a channel;
a pixel electrode formed within the image display region, the pixel electrode being applied with an image signal, by the data line, via the first switching element;
a first light shielding film formed in the image display region between the substrate and the first switching element, the first light shielding film being in complete overlap with the source, the drain, and the channel of the first switching element in plan view;
a second switching element to determine whether the image signal will be applied to the data line, the second switching element being located in the peripheral region, the second switching element including a semiconductor layer having a source region, a drain region, a channel region, and a gate electrode, the channel region being located between the source region and the drain region;
an interlayer insulating film; and
a second light shielding film formed in the peripheral region on an opposite side of the interlayer insulating film from the second switching element with the interlayer insulating film therebetween, the second light shielding film overlapping the source region, the drain region, and a portion of the channel region of the second switching element in plan view, the second light shielding film being divided into separate sections with the channel region of the second switching element as a boundary between the separate sections, the edges of the separate sections of the second light shielding film and the gate electrode overlapping with the each other in plan view by a distance of about 0.5 µm.

2. The electro-optical device according to claim 1,
the gate electrode being formed in a portion corresponding to the channel region.

3. The electro-optical device according to claim 1,
the second switching element being formed at the same time as the forming of the first switching element of the electro-optical device.

4. The electro-optical device according to claim 1,
the second light shielding film being made of light shielding material.

5. The electro-optical device according to claim 1, further comprising:
the first light shielding film being formed to correspond to the data line and the scanning line in the image display region, and
the second light shielding film being formed at the same time as the first light shielding film.

6. The electro-optical device according to claim 1,
the distance between the second light shielding film and the second switching element being 3000 nm or less.

7. An electronic apparatus, comprising:
the electro-optical device according to claim 1.

8. An electro-optical device, comprising:
a substrate having an image display region and a peripheral region surrounding the image display region;
a data line;
a scanning line extending in a direction crossing the data line;
a first switching element disposed in the image display region, the first switching element being applied with a scanning signal by the scanning line, the first switching element including a semiconductor layer having a source, a drain, and a channel;
a pixel electrode formed within the image display region, the pixel electrode being applied with an image signal, by the data line, via the first switching element;
a first light shielding film formed in the image display region between the substrate and the first switching element, the first light shielding film being in complete overlap with the source, the drain, and the channel of the first switching element in plan view;
a second switching element for determining whether the scanning signal will be applied to the scanning line, the second switching element being located in the peripheral region, the second switching element including a semiconductor layer having a source region, a drain region, a channel region, and a gate electrode, the channel region being located between the source region and the drain region;
an interlayer insulating film; and
a second light shielding film formed in the peripheral region on an opposite side of the interlayer insulating film from the second switching element with the interlayer insulating film therebetween, the second light shielding film overlapping the source region, the drain region, and a portion of the channel region of the second switching element in plan view, the second light shielding film being divided into separate sections with the channel region of the second switching element as a boundary between the separate sections, the edges of the separate sections of the second light shielding film and the gate electrode overlapping with the each other in plan view by a distance of about 0.5 µm.

* * * * *